United States Patent
Ishii et al.

(10) Patent No.: US 9,322,112 B2
(45) Date of Patent: Apr. 26, 2016

(54) APPARATUS AND METHOD FOR PRODUCTION OF SIC SINGLE CRYSTAL

(75) Inventors: Tomokazu Ishii, Susono (JP);
Hidemitsu Sakamoto, Susono (JP);
Kazuhiko Kusunoki, Amagasaki (JP);
Kazuhito Kamei, Hyogo (JP)

(73) Assignee: Toyota Jidosha Kabushiki Kaisha, Toyota-shi, Aichi-ken (JP)

( * ) Notice: Subject to any disclaimer, the term of this patent is extended or adjusted under 35 U.S.C. 154(b) by 1062 days.

(21) Appl. No.: 13/326,638

(22) Filed: Dec. 15, 2011

(65) Prior Publication Data

US 2012/0160153 A1    Jun. 28, 2012

(30) Foreign Application Priority Data

Dec. 28, 2010 (JP) ................................. 2010-293354

(51) Int. Cl.
*C30B 15/20* (2006.01)
*C30B 29/36* (2006.01)
*C30B 17/00* (2006.01)

(52) U.S. Cl.
CPC ................. *C30B 29/36* (2013.01); *C30B 17/00* (2013.01); *Y10T 117/1068* (2015.01); *Y10T 117/1088* (2015.01)

(58) Field of Classification Search
CPC .... C30B 17/00; C30B 29/36; Y10T 117/1068
See application file for complete search history.

(56) References Cited

U.S. PATENT DOCUMENTS

| 2,937,855 A | * | 5/1960 | Hazen ........................... 165/142 |
| 8,591,654 B2 | * | 11/2013 | Kitou et al. ................... 117/200 |
| 2008/0066676 A1 | * | 3/2008 | Mariner et al. ............... 118/715 |
| 2010/0101387 A1 | * | 4/2010 | Gupta et al. ...................... 83/39 |

FOREIGN PATENT DOCUMENTS

| JP | 2008-105896 | 5/2008 |
| JP | 2008-222453 | 9/2008 |
| JP | 2009-091222 | 4/2009 |
| JP | 2009-221041 | 10/2009 |
| JP | 2010184838 A | * 8/2010 |

OTHER PUBLICATIONS

Translation of JP 2010184838 A.*

* cited by examiner

*Primary Examiner* — Robert M Kunemund
*Assistant Examiner* — Hua Qi
(74) *Attorney, Agent, or Firm* — Finnegan, Henderson, Farabow, Garrett & Dunner, LLP

(57) ABSTRACT

To suppress 3D or convex growth and ensure a high flatness, an apparatus for producing an SiC single crystal includes: a container which holds an SiC solution, a portion for maintaining the solution in the container at a suitable temperature, a shaft having a lower end part acting as a portion for holding an SiC seed crystal in planar contact with an overall back surface of a crystal growth face and acting as a portion for cooling the SiC seed crystal, and a portion of the holding shaft for enabling an SiC single crystal to continuously grow at the crystal growth face by maintaining the crystal growth face brought into contact with the solution, a lower end part of the shaft having a portion for obtaining a uniform in-plane temperature distribution of the crystal growth face brought into planar contact, and a method for the same.

3 Claims, 9 Drawing Sheets

(1)

(2)

APPARATUS AND METHOD FOR PRODUCTION OF SIC SINGLE CRYSTAL

CROSS-REFERENCE TO RELATED APPLICATION

This application claims the priority of Japanese Application No. 2010-293354, filed Dec. 28, 2010, the contents of which are incorporated herein by reference.

TECHNICAL FIELD

The present invention relates to an apparatus and method for the production of a SiC single crystal by the solution method.

In a typical growth method of a SiC single crystal using the solution method, a silicon material is heated to melt in a graphite crucible. C from the graphite crucible is made to dissolve into the Si solution to obtain a SiC solution. A bottom part of a SiC seed crystal held at a bottom end of a holding shaft is brought into contact with the surface of the SiC solution. This bottom part is used as the starting point to grow a SiC single crystal. The growth of the SiC single crystal first starts from the bottom part of the SiC seed crystal. After that, succeeding growth of the SiC single crystal takes place from the bottom part of the grown SiC single crystal (crystal growth part). Therefore, a suitable temperature gradient whereby the temperature falls from the bottom to the top along the growth direction (vertical direction) has to be constantly maintained between the crystal growth part of this SiC single crystal and the contact surface of the SiC solution (solution surface). For this reason, the seed crystal has to be constantly cooled from the back surface (top surface) through the holding shaft.

Japanese Patent Publication (A) No. 2008-222453 discloses to cause the growth of a Group III nitride single crystal by the solution method during which providing a hollow structure at the back side (top side) of the seed crystal holding part and introducing cooling gas so as to cool the seed crystal for crystal growth (paragraphs 0025 and 0042). However, when applying this as is to growth of a SiC single crystal by the solution method, a location which is sprayed by the cooling gas is overly cooled, so fine relief shapes are formed at the crystal grown at the corresponding location, that is, 3D growth occurs, and crystal growth is promoted at this location resulting in convex growth and making flat crystal growth impossible.

Japanese Patent Publication (A) No. 2009-221041 discloses reacting a liquid material and a gaseous material to cause growth of a semiconductor single crystal during which formation of defects due to unevenness of the growth surface temperature when causing growth of the crystal is prevented by changing the in-plane distribution of the substrate temperature from the growth starting part, that is, the center part of the seed crystal, to the peripheral parts (temperature distribution in plane perpendicular to growth direction). However, in growth of a SiC single crystal by the solution method, to secure flat crystal growth, it is necessary to make the in-plane distribution of the substrate temperature uniform, so this cannot be employed.

SUMMARY OF INVENTION

The object of the present invention is to provide an apparatus and method which suppress 3D growth and convex growth in the solution method and enable the growth of SiC single crystal with a high flatness.

To achieve the above object, in a basic aspect, the present invention provides an apparatus for production of a SiC single crystal comprising:

a container which holds a SiC solution, a temperature controlling means for maintaining the SiC solution in the container at a suitable temperature, a holding shaft which has a lower end part which acts as a holding means for holding a SiC seed crystal in a state in planar contact with an overall back surface of a crystal growth face and which acts as a cooling means for cooling the SiC seed crystal, and a position controlling means of the holding shaft for enabling a SiC single crystal to continuously grow at the crystal growth face by maintaining the crystal growth face in a state brought into contact with the SiC solution, the apparatus for production of a SiC single crystal characterized in that the lower end part of the holding shaft has a temperature leveling means for obtaining a uniform in-plane temperature distribution of the crystal growth face brought into the above-mentioned planar contact.

To achieve the above object, the present invention provides a method of production of a SiC single crystal comprising the steps of preparing a container which holds a SiC solution, controlling the temperature so as to maintain the SiC solution in the container at a suitable temperature, holding a SiC seed crystal at a lower end part of a holding shaft in a state in planar contact with an overall back surface of a crystal growth face using the lower end part as a cooling means to cool the SiC seed crystal, and controlling the position of the holding shaft for enabling a SiC single crystal to continuously grow at the crystal growth face by maintaining the crystal growth face in a state brought into contact with the SiC solution, the method characterized by further having a step of obtaining a uniform in-plane temperature distribution of the crystal growth face brought into planar contact, by using a temperature leveling means provided at the lower end part of the holding shaft.

The present invention, in the basic aspect, has a holding shaft which has a lower end part which acts as a holding means for holding a SiC seed crystal in a state in planar contact with the overall back surface of the crystal growth face and which acts as a cooling means for cooling the SiC seed crystal. The lower end part has a temperature leveling means for achieving a uniform in-plane temperature distribution of the crystal growth face in the above-mentioned planar contact. Due to this, the speed of crystal growth from the crystal growth face is made uniform, 3D growth and convex growth are suppressed, and the flatness of a growing SiC single crystal is raised.

BEST MODE FOR CARRYING OUT THE INVENTION

Figure 1:
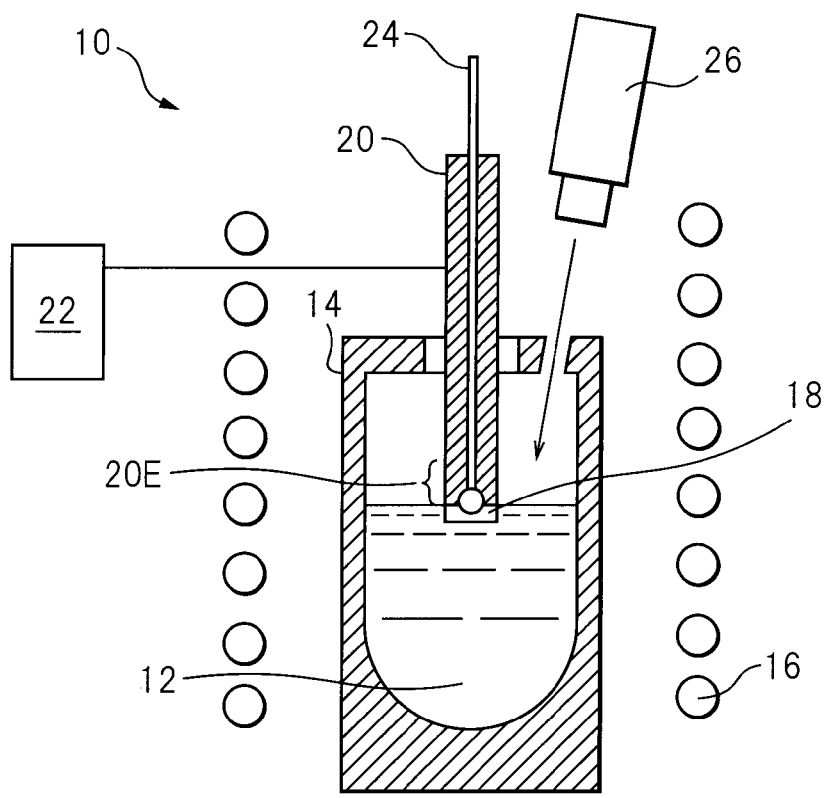
FIG. 1 is a schematic view showing (1) a basic configuration and (2) a lower end part of a holding shaft of an apparatus for causing growth of a SiC single crystal by the solution method.
Figure 1:
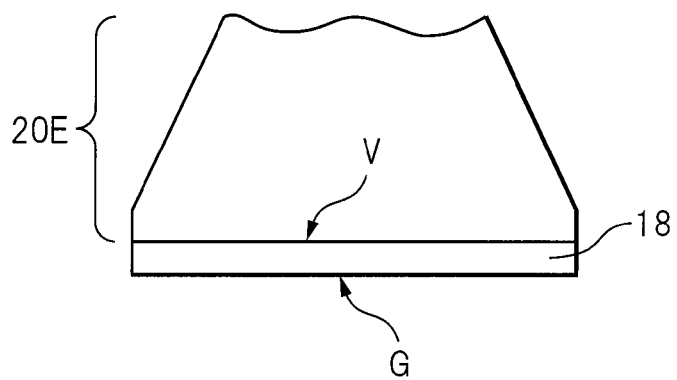

Referring to FIG. 1, an apparatus for production of a SiC single crystal by the solution method will be explained.

The production apparatus 10 is provided with a graphite or other container 14 which holds a SiC solution 12, a temperature controlling means including an induction coil 16 for maintaining the SiC solution in this container 14 at a suitable temperature, a holding shaft 20 which has a lower end part 20E which acts as a holding means for holding a SiC seed crystal 18 in a state of planar contact with an overall back surface V of a crystal growth face G and which acts as a cooling means for cooling the SiC seed crystal 18, and a position controlling means 22 of the holding shaft 20 for ensuring that the SiC single crystal continuously grows at the crystal growth face G by maintaining the crystal growth face G in a state brought into contact with the SiC solution 12.

Typically, an Si material is heated to melt in the graphite crucible 14 by the induction coil 16. Into this Si solution, C is made to dissolve from the graphite crucible 14 to obtain the SiC solution 12. At the surface of the SiC solution 12, the bottom part of the SiC seed crystal 18 which is held at the bottom end of the graphite holding shaft 20 is brought into contact. This bottom part is used as the starting point (=crystal growth face G) to make the SiC single crystal grow. The back surface temperature of the seed crystal 18 is suitably monitored by a thermocouple 24, while the front surface temperature of the solution 12 is suitably monitored by a thermal radiation thermometer 26.

The point of improvement of the present invention is the structure of the lower end part 20E of the holding shaft 20.

Figure 2:
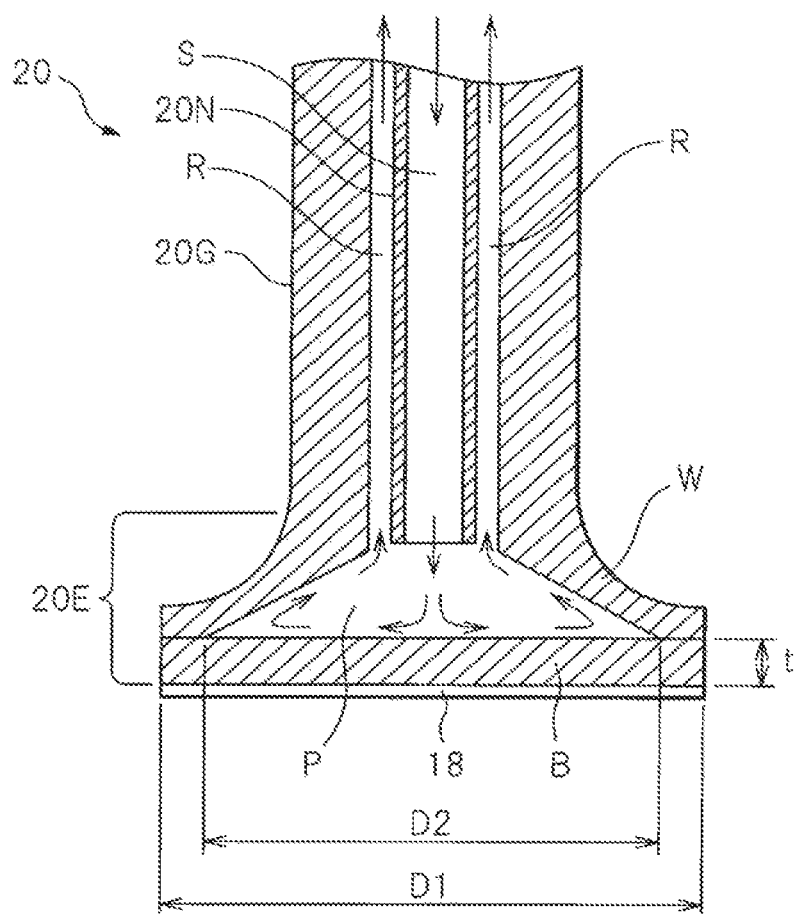
FIG. 2 is a schematic view showing a shape of a lower end part of a conventional holding shaft.

FIG. 2 shows the lower end part 20E of a conventional holding shaft 20 and the part of the body of the holding shaft 20 right above it. In the figure, the SiC seed crystal 18 is held in the state brought into planar contact with the lower end part 20E.

The holding shaft 20 is made a double-tube structure comprised of an inner tube 20N and an outer tube 20G. Inside of the inner tube 20N, a supply channel for a gas or other cooling fluid is formed. The clearance between the inner tube 20N and the other tube 20G forms a return channel R for the cooling fluid.

The lower end part 20E is a hollow body comprised of a bottom part B which holds the SiC seed crystal 18 at its outside and side walls W which rise up from the peripheral edges of this bottom part B and connect to the body of the holding shaft 20. The cooling fluid flows inside the hollow body P surrounded by the bottom part B and the side walls W along the arrows. That is, the cooling fluid which is ejected from the supply channel S strikes the center of the bottom part B to thereby flow to the surroundings and is discharged along the arrows from the return channel R.

In the holding shaft lower end part 20E of the above conventional structure, in the same way as explained in Japanese Patent Publication (A) No. 2008-222453, the center part of the bottom part B which the cooling fluid strikes is overly cooled, so fine relief shapes are formed at the crystal which is grown at the corresponding location of the seed crystal 18, that is, 3D growth occurs, and crystal growth is promoted at the center part resulting in convex growth and making flat crystal growth impossible.

Figure 3:
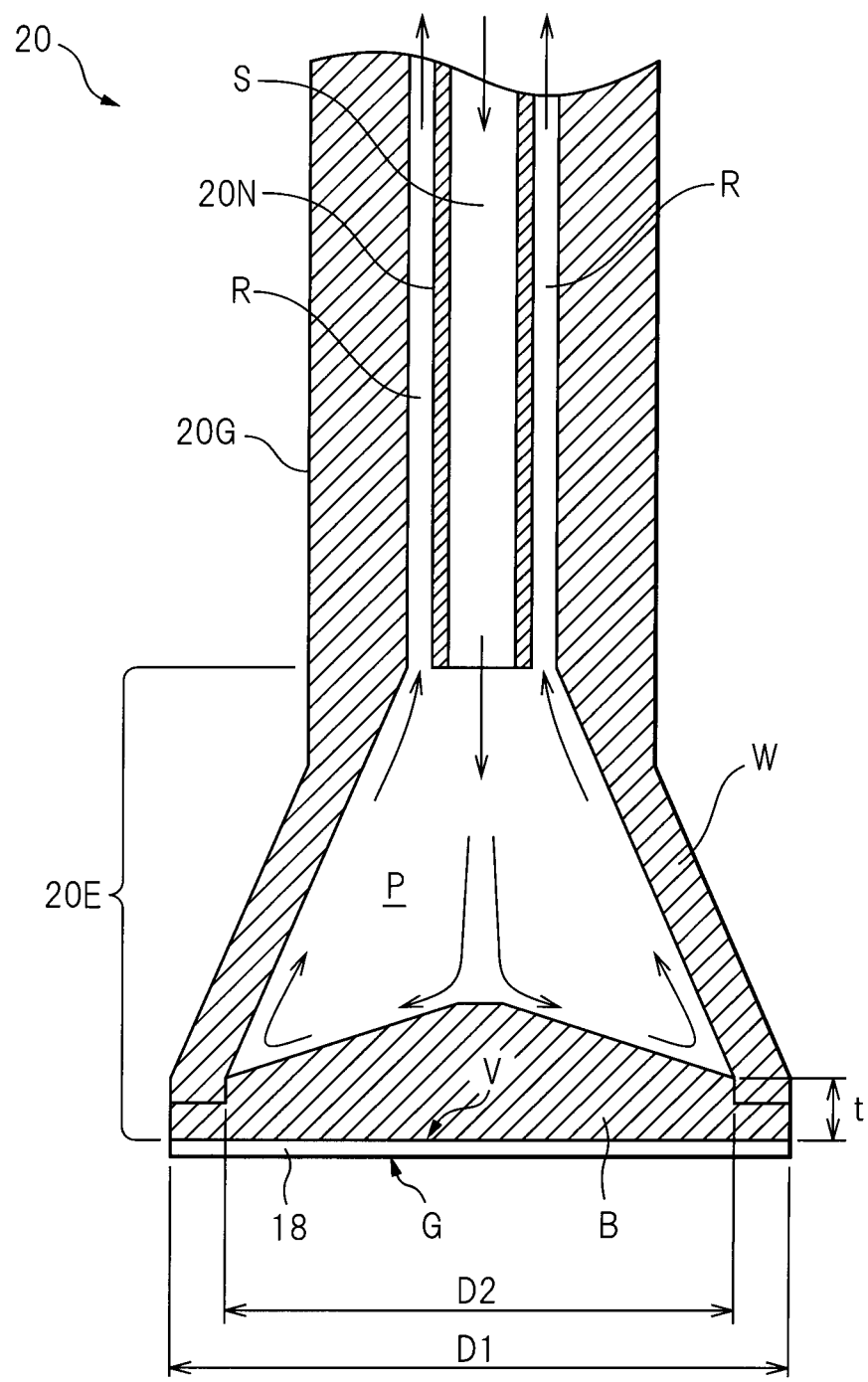
FIG. 3 is a schematic view showing a shape of a lower end part of a holding shaft of the present invention.

FIG. 3 shows the structure of the lower end part 20E of the holding shaft of the present invention for eliminating the above conventional defect.

That is, in the present invention, the lower end part 20E of the holding shaft 20 has a temperature leveling means for obtaining a uniform in-plane temperature distribution of the crystal growth face.

According to a preferred first embodiment of the present invention, the holding shaft 20 is provided with a supply channel S and return channel R of the cooling fluid which extend to the lower end part 20E through the inside of the body along the long direction, the lower end part 20E forms a hollow body surrounded by the bottom part B which holds the SiC single crystal in planar contact at its outside and side walls W which rise from the peripheral edges of this bottom part B and connect to the body of the holding shaft 20, so that cooling fluid which is sprayed from the supply channel S into the hollow body P strikes the bottom part B, cools the SiC single crystal through the bottom part B, and passes through the return channel R to be discharged from the hollow body, and the bottom part B of the hollow body is reduced in thickness from the center part where cooling fluid from the supply channel S strikes it toward the peripheral edges toward the return channel R and thereby acts as a temperature leveling means. That is, in a more preferred second aspect, the above apparatus for production of a SiC single crystal of the present invention is characterized in that a temperature leveling plate with a larger heat conductivity in a direction perpendicular to a growth direction of the SiC single crystal compared to that growth direction is interposed between the lower end part and the SiC seed crystal.

Due to this, before locations with a large gas cooling effect cool the seed crystal and crystal being grown, the temperature easily becomes uniform in the horizontal direction and therefore 3D crystal growth is further suppressed.

In a more preferable third aspect, the apparatus for production of a SiC single crystal of the present invention covers the outer circumference of the holding shaft by a heat insulating material.

EXAMPLE

Below, examples will be used to explain the present invention in more detail.

Comparative Example

The lower end part 20 of the conventional holding shaft shown in FIG. 2 was used to grow a SiC single crystal under the following conditions:

<Growth Conditions>
Cooling fluid: Ar gas
Thickness of bottom part (t): 5 mm
Taper angle of bottom part: 0° (flat)
Diameter of bottom part: D1=52φ, D2=36φ

The obtained SiC single crystal had a minimum thickness (peripheral edge parts)=163 μm and a maximum thickness (center part)=632 m. The ratio of the difference in the in-plane growth amounts to the maximum thickness was (632−163)/632×100=74%.

Example 1

The lower end part 20 of the holding shaft of the present invention shown in FIG. 3 was used to grow a SiC single crystal under the following conditions:
<Growth Conditions>
Cooling fluid: Ar gas
Thickness of bottom part (t): 15 mm
Taper angle of bottom part: 18°
Diameter of bottom part: D1=48φ, D2=40φ

The obtained SiC single crystal had a minimum thickness (peripheral edge parts)=416 μm and a maximum thickness (center part)=1085 μm. The ratio of the difference in the in-plane growth amounts to the maximum thickness was (1085−416)/1085×100=62%. The flatness was improved compared with the comparative example using the prior art.

Example 2

Figure 4:
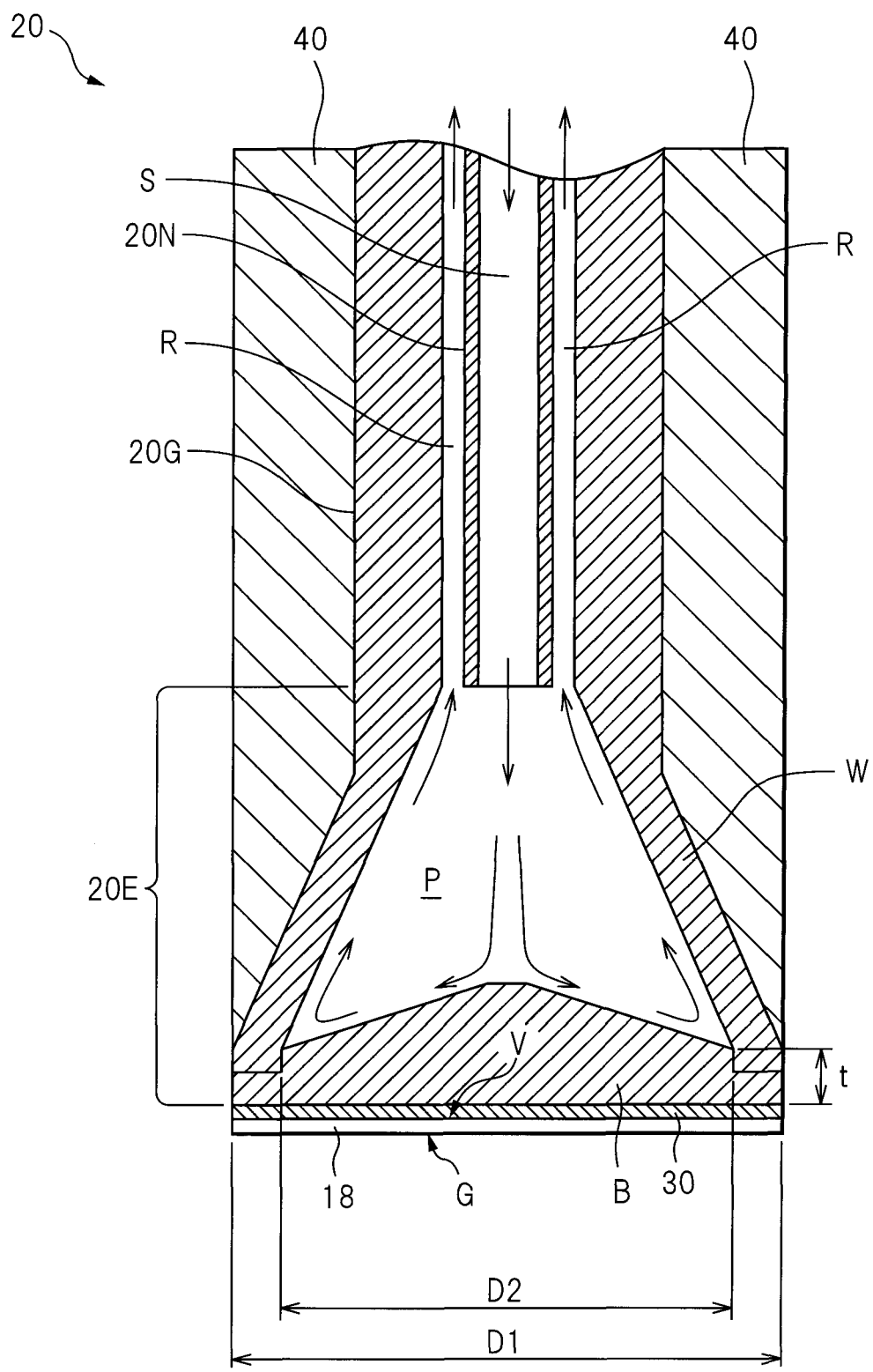
FIG. 4 is a schematic view showing a preferable aspect of a lower end part of a holding shaft of the present invention.

The lower end part 20E of a holding shaft 20 according to a preferred aspect of the present invention shown in FIG. 4 was used.

The lower end part 20E has the configuration of FIG. 3 plus a heat leveling plate 30 and a heat insulating material 40.

First, a pyrolytic graphite (PG) heat leveling plate 30 was interposed between the outer surface of the bottom part B and the SiC seed crystal 18. PG has a laminated structure in the plate thickness direction. The anisotropy of the heat conductivity is extremely great. The heat conductivity in the plate planar direction is 345 W/mK, while the heat conductivity in the plate thickness direction is 1.7 W/mK, that is, there is an approximately 200-fold difference. Compared with the plate thickness direction, that is, the SiC single crystal growth direction, the heat conductivity in the plate planar direction perpendicular to this is 200 times larger. This is extremely advantageous for obtaining a uniform in-plane temperature distribution.

Furthermore, the outer circumference of the holding shaft 20 was covered by a heat insulating material 40. The holding shaft 20 is constantly being heated from the furnace atmosphere above the high temperature (for example 2000° C.) SiC solution 12. The heat insulating material 40 cuts off the cooling fluid inside of the holding shaft 20 (in the present embodiment, Ar gas) from unpreferable heating.

The lower end part 20E of the holding shaft 20 of FIG. 4 was used to grow a SiC single crystal under the following conditions:
<Growth Conditions>
Cooling fluid: Ar gas
Thickness of bottom part (t): 5 mm
Thickness of temperature leveling plate: 3 mm
Taper angle of bottom part: 18°
Diameter of bottom part: D1=48φ, D2=40φ
Insulating material: carbon The obtained SiC single crystal had a minimum thickness (peripheral edge parts)=680 μm and a maximum thickness (center part)=984 μm. The ratio of the difference in the in-plane growth amounts to the maximum thickness was (984−680)/984×100=31%. The flatness was further improved compared with Example 1.

Figure 5:
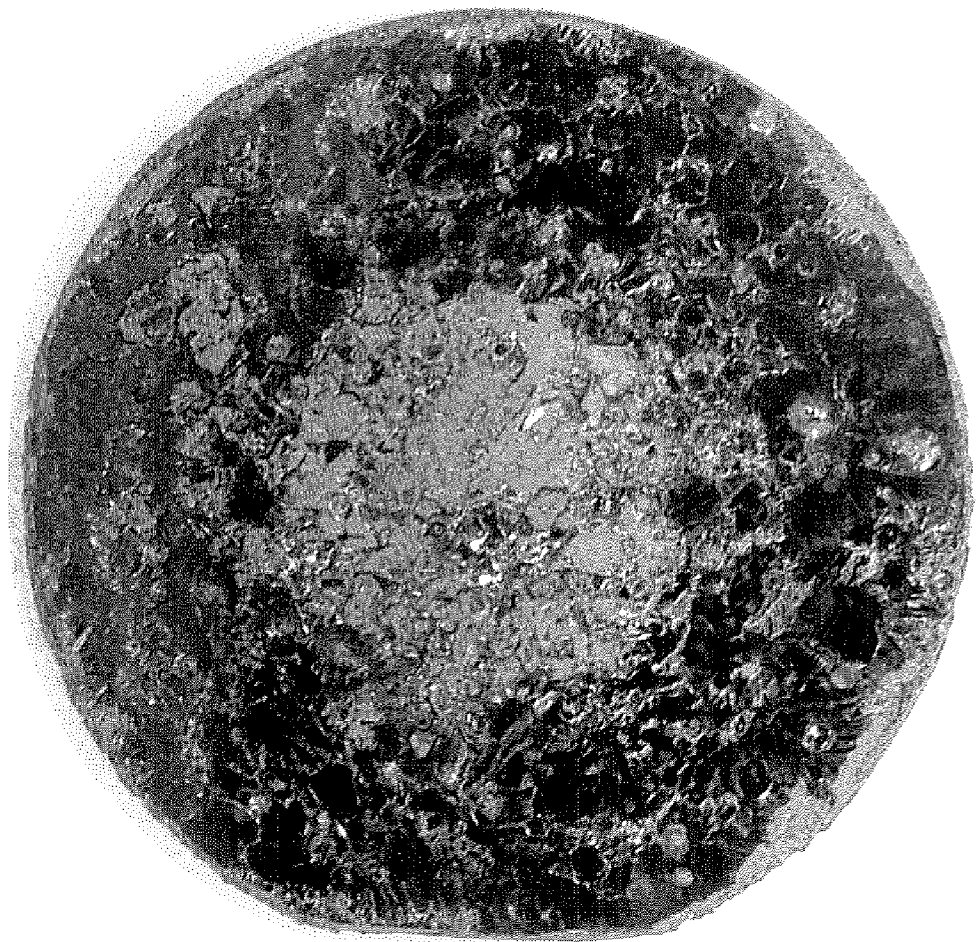
FIG. 5 is a photograph of the appearance of a growth surface of a SiC single crystal which is grown using a lower end part of the conventional holding shaft shown in FIG. 2.
Figure 6:
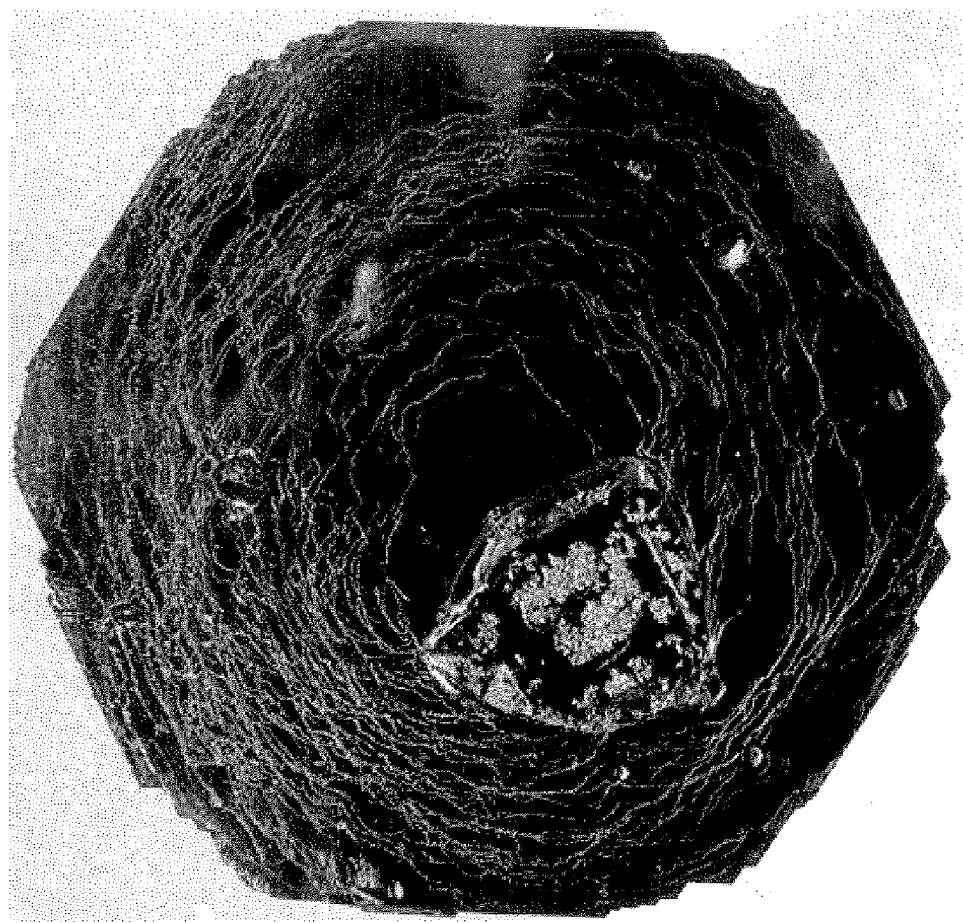
FIG. 6 is a photograph of the appearance of a growth surface of a SiC single crystal which is grown using a lower end part of the holding shaft of the present invention shown in FIG. 3.
Figure 7:
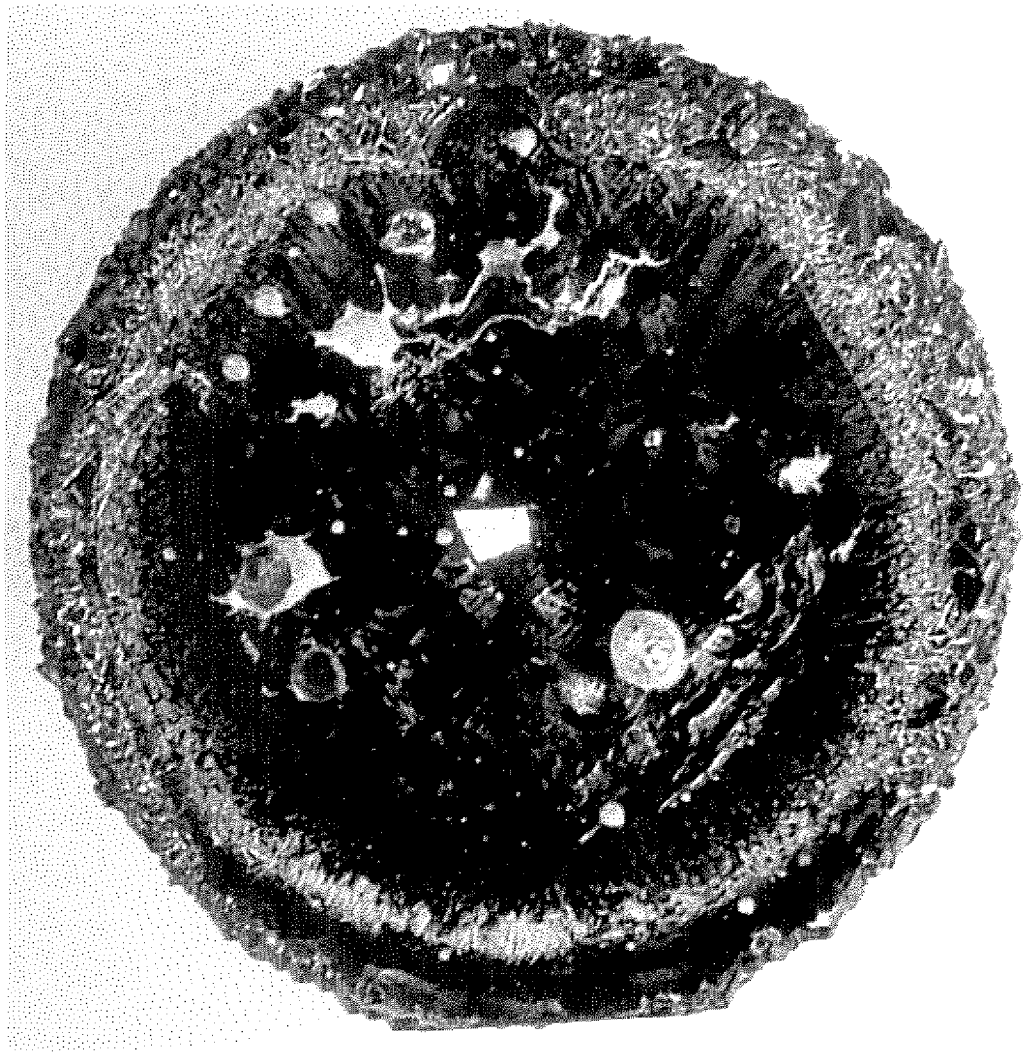
FIG. 7 is a photograph of the appearance of a growth surface of a SiC single crystal which is grown using a lower end part of a holding shaft of a preferable aspect of the present invention shown in FIG. 4.

FIGS. 5, 6, and 7 show photographs of the appearances of growth surfaces of SiC single crystals obtained in the comparative example, Example 1, and Example 2. It is understood that the flatness of the growth surface is improved in that order.

Example 3

How the present invention improved the flow of the cooling fluid in the internal space P of the lower end part 20E of the holding shaft 20 was studied by simulation of the flow rate distribution of the fluid.

Figure 8:
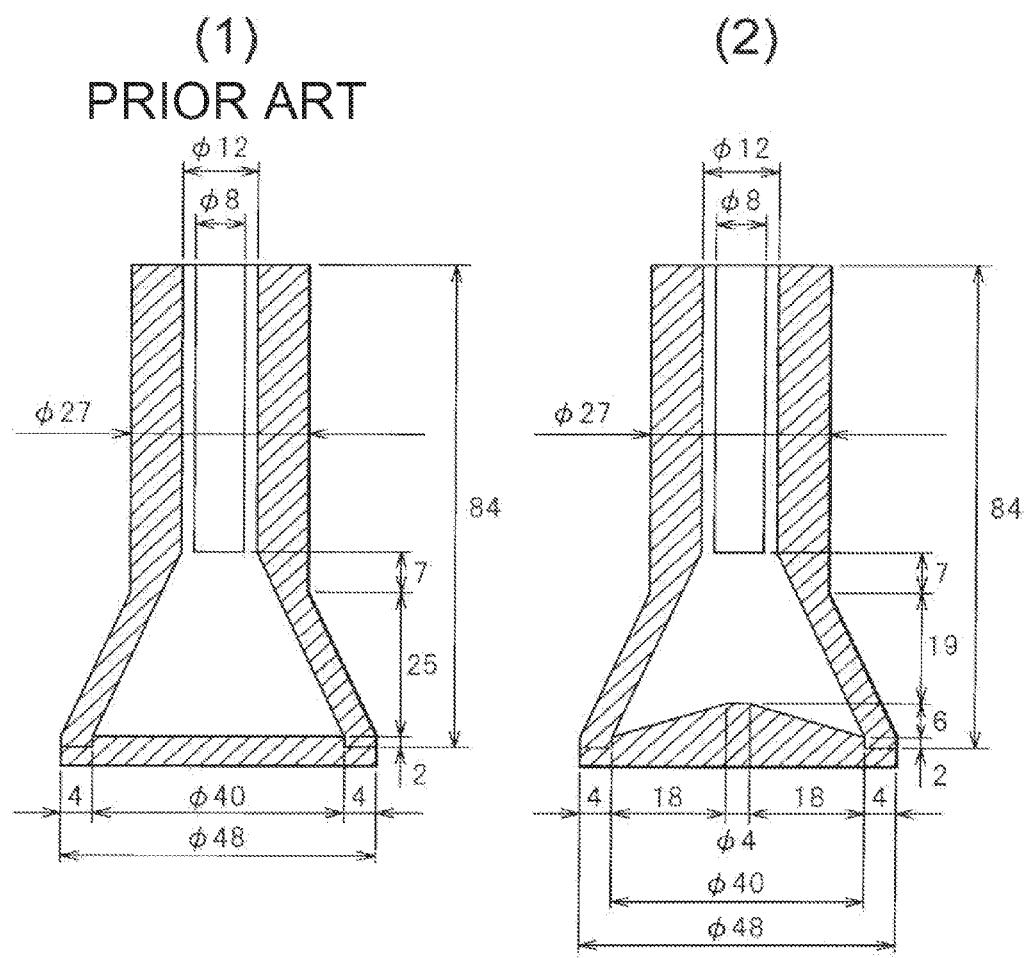
FIG. 8 shows a model used for calculating by simulation the flow of cooling gas for the lower end parts of holding shafts of (1) an example of the prior art and (2) an example of the present invention.
Figure 9:
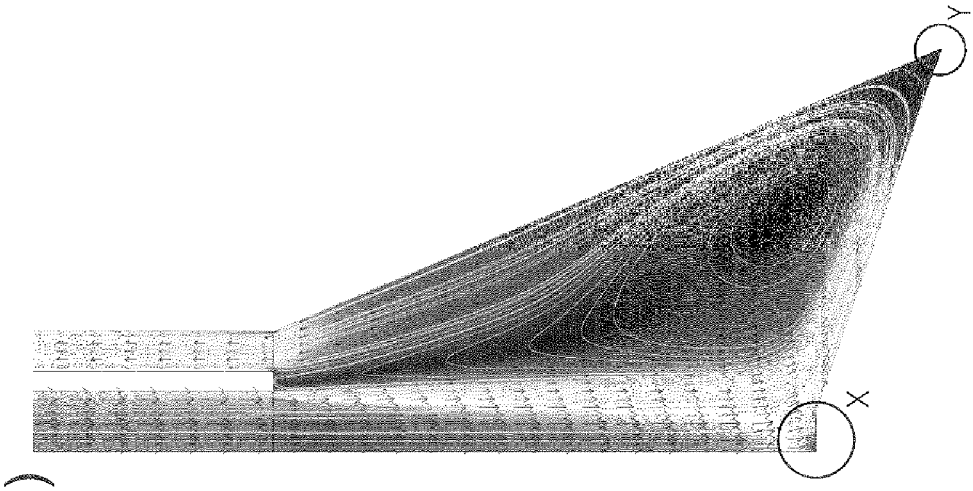
FIG. 9 shows the flow of cooling gas calculated by simulation using the model of FIG. 8 for the lower end parts of holding shafts of (1) an example of the prior art and (2) an example of the present invention.
Figure 9:
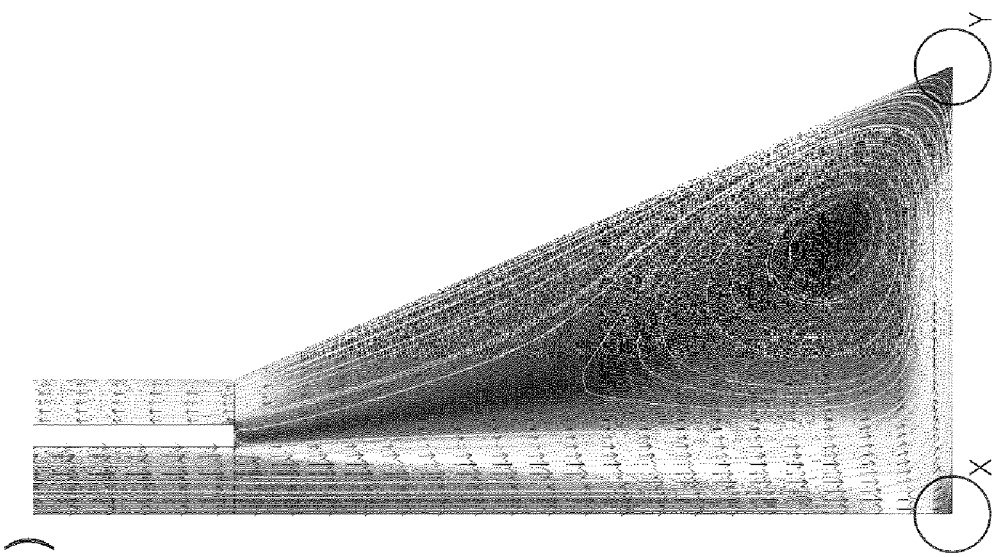

FIG. 8 shows the models of (1) an example of the prior art and (2) an example of the present invention used, while FIG. 9 shows the results of simulation of the (1) example of the prior art and (2) the example of the present invention.
<Simulation Conditions>
Flow rate: 5 L/min
Maximum flow speed: 3.5 m/s
Artificial dispersion conditions
Flow line diffusion
Advection diffusion=0.1
Display conditions
Flow lines: 30
Number of vectors: 50×50

For the example of the prior art (1) and the example of the present invention (2), it is learned that in both cases stagnant flow parts (circled parts) occurred at X (center of bottom part) and Y (peripheral edge of bottom part), but due to the present invention (2), the size of the stagnant flow parts becomes smaller. Due to this, according to the present invention, it is believed that cooling fluid flows smoother and greater uniformity of the in-plane temperature distribution is promoted.

INDUSTRIAL APPLICABILITY

According to the present invention, there are provided an apparatus and method for suppressing 3D growth and convex growth in the solution method so as to grow a highly flat SiC single crystal.

EXPLANATION OF REFERENCES

10 production apparatus
12 SiC solution
14 graphite or other container
16 induction coil
18 SiC seed crystal
20 holding shaft
20E lower end part of holding shaft
22 position controlling means of holding shaft
24 thermocouple
26 thermal radiation thermometer
20N inner tube of holding shaft
20G outer tube of holding shaft
30 heat leveling plate
40 heat insulating material
S supply channel of cooling fluid
R return channel of cooling fluid
B bottom part of lower end part of holding shaft
W side walls of lower end part of holding shaft
P hollow body of lower end part of holding shaft

The invention claimed is:

1. An apparatus for producing a SiC single crystal comprising:
   a container which holds a SiC solution,
   an induction coil for maintaining said SiC solution in said container at a suitable temperature,
   a holding shaft which has a lower end part for holding a SiC seed crystal in a state in planar contact with an overall back surface of a crystal growth face and for cooling said SiC seed crystal, and
   wherein a position of said holding shaft is controlled for enabling the SiC single crystal to continuously grow at said crystal growth face by maintaining said crystal growth face in a state brought into contact with said SiC solution,
   wherein said holding shaft is provided with a supply channel and a return channel for a cooling fluid which extend to said lower end part through a body of said holding shaft along its length direction,
   said lower end part of said holding shaft forms a hollow body surrounded by a bottom part which holds said SiC single crystal in planar contact with its outside and side walls which rise from peripheral edges of said bottom part and connect to said body of said holding shaft, so that said cooling fluid which is sprayed from said supply channel into said hollow body strikes said bottom part and cools said SiC single crystal through said bottom part and passes through said return channel to be discharged from said hollow body, and
   said bottom part of said hollow body is reduced in thickness from the center part where said cooling fluid from said supply channel strikes toward the peripheral edges toward said return channel.

2. The apparatus for producing the SiC single crystal as set forth in claim 1, wherein
   a temperature leveling plate with a higher heat conductivity in a direction perpendicular to a growth direction of the SiC single crystal compared to that growth direction is interposed between said lower end part and said SiC seed crystal.

3. The apparatus for producing the SiC single crystal as set forth in claim 1, which
   covers an outer circumference of said holding shaft by a heat insulating material.

* * * * *